(12) United States Patent  (10) Patent No.: US 8,563,426 B2
Chumakov et al.  (45) Date of Patent: Oct. 22, 2013

(54) SHRINKAGE OF CONTACT ELEMENTS AND VIAS IN A SEMICONDUCTOR DEVICE BY INCORPORATING ADDITIONAL TAPERING MATERIAL

(75) Inventors: Dmytro Chumakov, Dresden (DE); Tino Hertzsch, Bobritzsch (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/208,697

(22) Filed: Aug. 12, 2011

(65) Prior Publication Data

US 2012/0161327 A1    Jun. 28, 2012

(30) Foreign Application Priority Data

Dec. 28, 2010 (DE) .......................... 10 2010 064 289

(51) Int. Cl.
*H01L 21/4763*    (2006.01)
*H01L 21/302*    (2006.01)
*H01L 21/461*    (2006.01)

(52) U.S. Cl.
USPC ............ 438/640; 438/638; 438/639; 438/689

(58) Field of Classification Search
USPC .................. 438/636, 637, 638, 639, 640, 689
See application file for complete search history.

(56) References Cited

U.S. PATENT DOCUMENTS

| 5,744,386 | A | * | 4/1998 | Kenney .......................... 438/245 |
| 5,940,732 | A | | 8/1999 | Zhang ............................ 438/640 |
| 2001/0046741 | A1 | * | 11/2001 | Reinberg ....................... 438/275 |
| 2004/0065956 | A1 | * | 4/2004 | Teh et al. ....................... 257/751 |
| 2006/0121739 | A1 | | 6/2006 | Farber et al. .................. 438/695 |
| 2008/0303169 | A1 | | 12/2008 | Goller et al. .................. 257/774 |
| 2010/0055902 | A1 | | 3/2010 | Frohberg et al. .............. 438/675 |

FOREIGN PATENT DOCUMENTS

DE    102004044686 A1    3/2006
DE    102008045036 A1    7/2010

OTHER PUBLICATIONS

Translation of Official Communication from German Patent Office for German Patent Application No. 10 2010 064 289.4 dated Jun. 20, 2011.

* cited by examiner

*Primary Examiner* — Walter H Swanson
*Assistant Examiner* — Wilner Jean Baptiste
(74) *Attorney, Agent, or Firm* — Williams, Morgan & Amerson, P.C.

(57) ABSTRACT

Vertical contact structures, such as contact elements connected to semiconductor-based contact regions in device areas comprising densely-spaced gate electrode structures, are formed for given lithography and patterning capabilities by incorporating at least one additional dielectric layer of superior tapering behavior into the dielectric material system.

10 Claims, 8 Drawing Sheets

SHRINKAGE OF CONTACT ELEMENTS AND VIAS IN A SEMICONDUCTOR DEVICE BY INCORPORATING ADDITIONAL TAPERING MATERIAL

BACKGROUND OF THE INVENTION

1. Field of the Invention

The present disclosure generally relates to the field of semiconductor manufacturing, and, more particularly, to contact elements and vias formed in a dielectric material system on the basis of high aspect ratio openings.

2. Description of the Related Art

Semiconductor devices, such as advanced integrated circuits, typically contain a very high number of circuit elements, such as transistors, capacitors, resistors and the like, which are usually formed in a substantially planar configuration above an appropriate substrate having formed thereon a semiconductor layer. Due to the high number of circuit elements and the required complex layout of modern integrated circuits, the electrical connections of the individual circuit elements may generally not be established within the same level on which the circuit elements are manufactured, but require a plurality of additional wiring layers, which are also referred to as metallization layers. These metallization layers generally include metal-containing lines, providing the inner-level electrical connection, and also include a plurality of inter-level connections, which are also referred to as vias, that are filled with an appropriate metal and provide the electrical connection between two neighboring stacked metallization layers.

Due to the continuous reduction of the feature sizes of circuit elements in modern integrated circuits, the number of circuit elements for a given chip area, that is, the packing density of the circuit elements, also increases, thereby necessitating an adequate number of electrical connections to provide the desired circuit functionality. Therefore, the number of stacked metallization layers usually increases as the number of circuit elements per chip area becomes larger, while, nevertheless, the sizes of individual metal lines and vias are reduced.

Similarly, the contact structure of the semiconductor device, which may be considered as an interface connecting the circuit elements of the device level with the metallization system, has to be adapted to the reduced feature sizes in the device level and the metallization system. For this reason, very sophisticated patterning strategies may have to be applied in order to provide the contact elements with the required density and with appropriate reduced dimensions, at least at the device level side, in order to connect to the contact regions, such as drain and source regions, gate electrode structures and the like, without contributing to pronounced leakage current paths and even short circuits and the like. In many conventional approaches, the contact elements or contact plugs are typically formed by using a tungsten-based metal together with an interlayer dielectric stack that is typically comprised of silicon dioxide in combination with an etch stop material, such as a silicon nitride material. Due to the very reduced critical dimensions of the circuit elements, such as the transistors, the respective contact elements have to be formed on the basis of contact openings with an aspect ratio which may be as high as approximately 8:1 or more, wherein a diameter of the contact openings may be 0.1 μm or significantly less for transistor devices of, for instance, the 65 nm technology node. In even further sophisticated approaches, and in very densely packed device regions, the width of the contact openings may be 50 nm and less. Generally, an aspect ratio of such contact openings may be defined as the ratio of the depth of the opening relative to the width of the opening.

Hence, after providing the contact opening with the required minimum width, an appropriate conductive material, such as tungsten, possibly in combination with an appropriate barrier layer system, has to be deposited, which may typically be accomplished on the basis of a sputter deposition technique, for instance, for the barrier materials, and chemical vapor deposition (CVD)-like process recipes for forming the tungsten material.

Upon further reducing the critical dimensions of transistor elements, the complexity of the patterning process, i.e., of the lithography process and the subsequent etch process for forming the openings in the interlayer dielectric material system, may result in severe contact failures when densely packed device regions are considered. For example, in densely packed device regions, transistors and, thus, gate electrode structures have to be positioned close to each other in view of the corresponding design requirements, wherein drain and source regions may have to be contacted between the closely spaced gate electrode structures, however, without producing leakage paths to the gate electrode. Consequently, the patterning process has to provide contact openings with a lateral width that is less than the spacing between closely spaced gate electrode structures, while at the same time a high degree of accuracy in appropriately aligning the corresponding etch mask may result in extremely reduced process margins.

In sophisticated semiconductor devices, the lateral distance between closely spaced gate electrode structures may require a minimum lateral dimension of the contact openings that may be well beyond the capabilities of the lithography process, thereby requiring appropriate etch strategies in order to reduce the critical dimensions, at least at the bottom of the contact openings, in an appropriate manner that enables the contacting of critical drain and source areas without unduly increasing the probability of creating leakage paths or short circuits between the contact elements and the gate electrode structures.

With reference to FIGS. 1a-1d, a typical approach for forming sophisticated contact elements will now be described in more detail.

FIG. 1a schematically illustrates a cross-sectional view of a semiconductor device 100 in an advanced manufacturing stage, in which contact elements are to be formed so as to connect to critical device areas in a semiconductor material. As shown, the semiconductor device 100 comprises a substrate 101, above which is provided a semiconductor layer 102, such as a silicon layer, which, in turn, may comprise a plurality of active regions 102A, i.e., semiconductor regions, in and above which transistor elements are formed. For convenience, a single active region 102A is illustrated in FIG. 1a and may represent a semiconductor region, above which a plurality of gate electrode structures 110 are formed. For example, the gate electrode structures 110 represent closely spaced gate electrode structures 110A, 110B, 110C, which have critical dimensions of 50 nm and less, while also a spacing between the individual gate electrode structures 110 may be of the same order of magnitude. For example, the gate electrode structures 110 may comprise an electrode material 111 that is separated from the active region 102A by a gate dielectric material 112. Furthermore, frequently the gate electrode structures 110 may comprise a spacer structure 113, for instance in the form of an oxide material, a nitride material and the like. It should be appreciated, however, that, in this manufacturing stage, the spacer structure 113 may have been removed, if considered appropriate for the further processing of the device 100. Between the closely spaced gate electrode structures 110, corresponding contact regions 102C may be provided, at least some of which may have to be contacted by corresponding contact elements 125A, 125B, indicated as dashed lines, which have to be formed during the further processing of the device 100. Consequently, the contact element 125A, 125B may have lateral design dimensions, which are less than the lateral distance at least between the gate electrode materials 111, wherein also a certain process tolerance in view of any misalignments during the further processing may have to be taken into consideration. The contact elements 125A, 125B have to be formed in an interlayer dielectric material system 120, which may be comprised of any appropriate material, such as silicon dioxide, silicon nitride and the like. In the example shown, the material system 120 may comprise substantially a single material 121, which may provide the desired gap fill capabilities upon depositing the dielectric material, thereby reliably filling the space between the closely spaced gate electrode structures 110.

The semiconductor device 100 may be formed on the basis of the following processes. Appropriate active regions in the semiconductor layer 102 are formed by using well-established process techniques for incorporating an isolation structure (not shown) which laterally delineates the corresponding active regions 102A. Thereafter, materials for the gate electrode structures 110 and for the patterning thereof are deposited or formed by any other process techniques, followed by complex lithography and etch strategies in order to provide the gate electrode structures 110 with the desired lateral dimensions and the lateral distance according to the design rules of the device 100. It should be appreciated that, in some sophisticated approaches, the gate electrode structures 110 may be formed on the basis of a high-k dielectric material in combination with a metal-containing electrode material, while, in other cases, any such sophisticated material systems may be provided in a further advanced manufacturing stage, for instance prior to completing the dielectric material system 120, and the like. Thereafter, any further processes may be performed, such as incorporating any required materials into the semiconductor layer 102, for instance with respect to adjusting the strain conditions and the like, followed by the incorporation of appropriate dopant species, as is required for forming drain and source regions of transistors, a part of which may be represented by the gate electrode structures 110. During these manufacturing processes, also the spacer structure 113 or at least a portion thereof may be provided in accordance with the overall process and device requirements. After any anneal processes, the conductivity of the contact regions 102C may be increased, for instance, by forming a metal silicide and the like, while, in other cases, any such processes may be applied after patterning the dielectric material system 120. The one or more materials of the system 120 may be provided on the basis of well-established deposition techniques, wherein, in sophisticated applications, process parameters and materials of the system 120 are selected such that a reliable filling of the space between the closely spaced gate electrode structures 110 is accomplished. To this end, in some cases, an appropriate etch stop layer (not shown) may be provided, while, in other cases, a substantially homogeneous material composition is formed, for instance on the basis of a silicon dioxide material, wherein the resulting surface topography, caused by the gate electrode structures 110, is typically planarized by performing appropriate processes, such as chemical mechanical polishing (CMP) and the like. Thereafter, any further deposition processes are performed in order to provide an appropriate material system for performing sophisticated lithography and etch processes in order to pattern the material 120 for forming appropriate contact openings for the contact element 125A, 125B. To this end, a planarization material, which may typically be provided in the form of a polymer material, is provided, for instance by spin-on techniques and the like, followed by the deposition of an appropriate anti-reflective coating (ARC) layer. Finally, at least one resist layer is formed above the material system whose thickness and material composition is selected so as to comply with the requirements of a sophisticated exposure process for defining the lateral size and position of contact openings to be formed in the material system 120.

FIG. 1b schematically illustrates a cross-sectional view of the semiconductor device 100 in a further advanced manufacturing stage. As shown, a stack of material layers 130 is formed above the dielectric material system 120 and comprises a resist layer 131, followed by an ARC layer 132 and a planarization layer 133. This layer system is patterned on the basis of sophisticated lithography techniques, in which the resist material 131 is exposed on the basis of a lithography mask in order to form latent images in the resist material 131, which may result, after developing the resist material, in corresponding mask openings 131A that coarsely define the lateral size and position of contact openings 121A to be formed in the material system 120. It should be appreciated that the openings 131A are typically formed with process margins of the corresponding lithography process that may be at or near the limits of the resolution capability of the lithography process. Based on the openings 131A, the ARC layer 132 is typically patterned by using an appropriate etch strategy, wherein frequently the process parameters of the etch process are selected so as to form the corresponding openings 132A in the ARC material with a pronounced degree of tapering, which is to be understood as providing sidewall surface areas 132S with a desired grade sidewall angle, indicated as angle α.

It should be appreciated that a sidewall angle of any etched openings is hereinafter to be understood as the average angle formed by the sidewall surface areas with respect to a surface normal. Thus, a substantially perpendicular surface corresponds to a sidewall angle of zero. Consequently, the openings 132A may have a reduced lateral dimension, at least at the bottom thereof, and may thus act as an efficient etch mask for the patterning of the planarization layer 133 in order to form openings 133A therein. Thus, the openings 133A may typically have a reduced lateral width compared to the mask openings 131A initially formed in the resist material 131. On the basis of the mask openings 133A, the material 120 is patterned by using any well-established anisotropic etch strategies, wherein, typically, also a certain degree of tapering is desirable in order to further reduce the lateral dimensions of the contact openings 121A, at least in the vicinity of the gate electrode structures 110.

It is well known that plasma-assisted anisotropic etch recipes rely on process parameters, such as plasma power, reactive components, polymer residues and the like, which may affect the finally-achieved vertical and lateral etch rate. For example, upon increasing directionality and kinetic energy of ions that are present in the etch ambient, a more pronounced reduction of the lateral etch rate may be achieved. Furthermore, adding specific polymerizing gas components may also provide an efficient mechanism for controlling the lateral etch rate, since any such polymerizing gas components may result in a more or less pronounced generation of etch byproducts which may preferably accumulate at the sidewalls 121S within the openings 121A. It should be appreciated, however, that generally the degree of controllability of the lateral etch rate may also significantly depend on the material composition of the basic material to be etched so that, generally, a very limited range for modulating the lateral dimensions of the contact openings 121A during a corresponding etch process is available. For example, silicon dioxide, which is a well-established dielectric material for passivating critical circuit elements, such as the gate electrode structures 110, may allow only a very moderate degree of tapering during the plasma-assisted etch process so that at least the mask opening 133A has to be appropriately adapted with respect to the design rules of the gate electrode structures 110 in order to form the contact openings 121A while reducing the probability of exposing any electrode material 111 during the corresponding etch process.

It should be appreciated that, prior to or during the entire patterning strategy for patterning the layer system 130 and the dielectric material system 120, at least a portion of the materials of the system 130 may be removed, if considered appropriate. At least after exposing the contact regions 102C, any sacrificial material may be removed and the processing is continued by filling the contact openings 121A with a conducting material, such as tungsten, and the like, possibly in combination with appropriate barrier materials, if required.

FIG. 1c schematically illustrates the semiconductor device 100 in a further advanced manufacturing stage. As illustrated, the contact elements 125A, 125B comprise an appropriate conductive material 126 and thus provide an electrical connection to the contact regions 102C. For sophisticated applications, in which the lateral distance between the gate electrode structures 110 has to be reduced in view of the corresponding design rules, in particular at areas 114, a certain risk exists that leakage paths or short circuits may be generated between the contact elements 125A, 125B and some of the gate electrode structures 110.

FIG. 1d schematically illustrates the situation for the semiconductor device 100 when even further sophisticated design rule requirements have to be implemented. As shown, the lateral distance between the gate electrode structures 110 may have to be reduced, wherein the dashed line schematically illustrates the lateral size of a corresponding contact element 125, which may be formed on the basis of the process strategy as described above with reference to FIGS. 1a-1c. In this case, the above-described process sequence will nearly certainly result in the exposure of the electrode material 111 of at least some of the gate electrode structures 110, thereby creating severe contact failures. Consequently, for highly sophisticated applications requiring design dimensions of approximately 40 nm and less for the gate electrode structures 110, the above-specified process strategy may be less than desirable in device areas comprising closely-spaced gate electrode structures. For this reason, in some conventional approaches, it has been suggested to form a dielectric liner material after patterning the contact openings in order to cover any exposed critical areas, such as exposed portions of the electrode material 111. To this end, additional deposition steps are required and a subsequent patterning process may have to be performed in order to reliably reopen the contact openings at the bottom thereof, wherein, however, still a reliable coverage of critical areas within the contact openings is to be preserved. Hence, a very limited shrinkage of contact openings may be achieved on the basis of the additional liner material, while, at the same time, the overall process complexity, for instance with respect to deposition and patterning processes, is increased.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure generally provides semiconductor devices and manufacturing techniques in which vertical contact elements, such as contact elements connecting to semiconductor areas, contact elements connecting to metal regions of metallization systems and the like, may be formed with reduced lateral dimensions by increasing the degree of tapering during the patterning of a corresponding dielectric material system. To this end, in some illustrative embodiments disclosed herein, at least one material layer is incorporated into the dielectric material system that has a superior etch behavior in order to enable the patterning of this layer with an increased sidewall angle. Consequently, by providing the additional dielectric layer with the superior tapering behavior above any critical areas in the dielectric material system, the corresponding lateral dimension of the contact opening may be reduced prior to etching through the critical device areas. In some illustrative embodiments disclosed herein, contact elements extending through the dielectric material system provided for passivating closely-spaced gate electrode structures may be efficiently formed by using at least one additional dielectric layer of superior tapering behavior. In this manner, conventional lithography strategies may still be used in semiconductor devices in which the design requirement would result in undue contact failures based on conventional patterning strategies, without unduly contributing to additional complexity of the overall patterning process.

One illustrative method disclosed herein relates to forming contact elements of a semiconductor device. The method comprises forming an etch mask above an interlayer dielectric material system, wherein the etch mask has a mask opening. The method further comprises forming a first portion of a contact opening in a first part of the interlayer dielectric material system by using the mask opening, wherein the first portion has a first sidewall angle. The method additionally comprises forming a second portion of the contact opening in a second part of the interlayer dielectric material by using the first portion of the contact opening as an etch mask, wherein the second portion of the contact opening has a second sidewall angle that differs from the first sidewall angle. Moreover, a depth of the contact opening is increased so as to connect to a contact region that is formed in a semiconductor region. Finally, the method comprises filling the contact opening with a conductive material so as to form a first contact element connecting to the contact region.

A further illustrative method disclosed herein relates to forming a vertical contact element of a semiconductor device. The method comprises forming a dielectric material system above a contact region of the semiconductor device, wherein the dielectric material system has at least a first dielectric layer formed above a second dielectric layer, wherein the first and second dielectric layers have a different tapering behavior when exposed to reactive etch atmospheres. Furthermore, the method comprises forming a first portion of a contact opening in the first dielectric layer by using an etch mask that is formed above a first dielectric layer. The method further comprises forming a second portion of the contact opening in the second dielectric layer and increasing a depth of the contact opening so as to extend to the contact region. Additionally, the method comprises filling the contact opening with a conductive material.

One illustrative semiconductor device disclosed herein comprises a contact region and a dielectric material system formed above the contact region. Furthermore, the semiconductor device comprises a vertical contact element that is formed in the dielectric material system so as to connect to the contact region, wherein the vertical contact element has at least a first portion embedded in a first part of the dielectric material system and has a second portion that is formed below the first portion and that is embedded in a second part of the dielectric material system. Moreover, the first and second portions of the vertical contact element have different sidewall angles.

BRIEF DESCRIPTION OF THE DRAWINGS

The disclosure may be understood by reference to the following description taken in conjunction with the accompanying drawings, in which like reference numerals identify like elements, and in which.

Figure 1A:
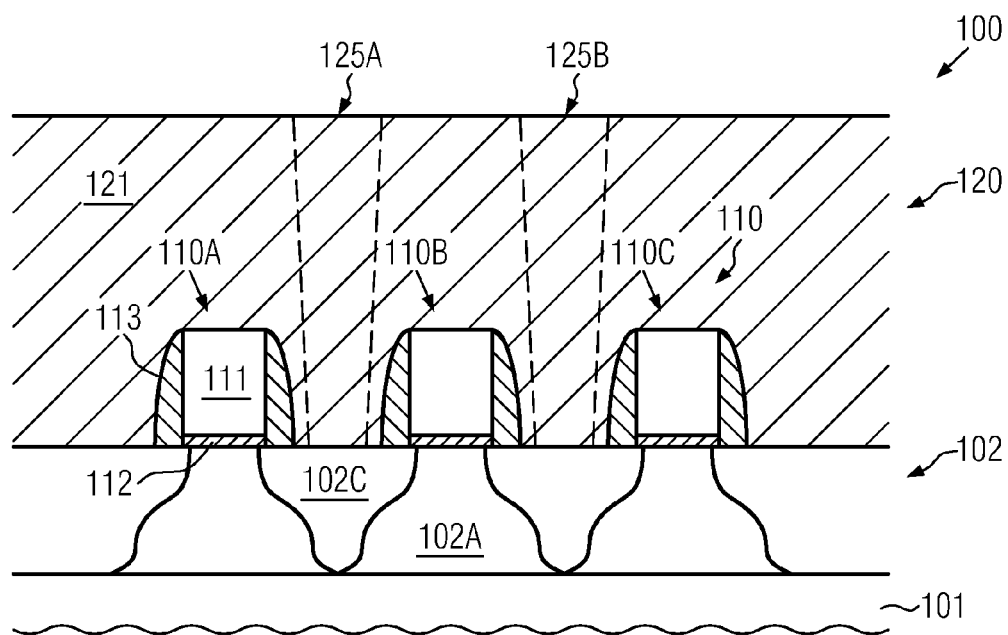
FIGS. 1a-1c schematically illustrate cross-sectional views of a semiconductor device during a patterning strategy for forming sophisticated contact elements during various manufacturing stages of a conventional approach.
Figure 1B:
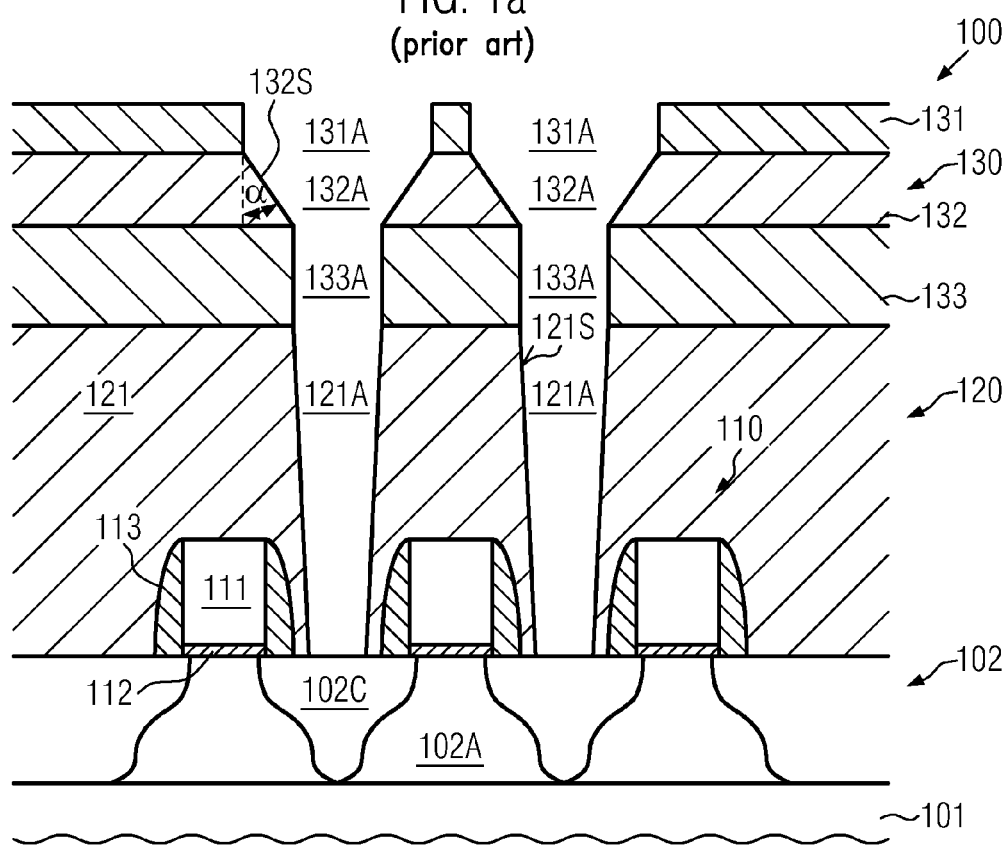
Figure 1C:
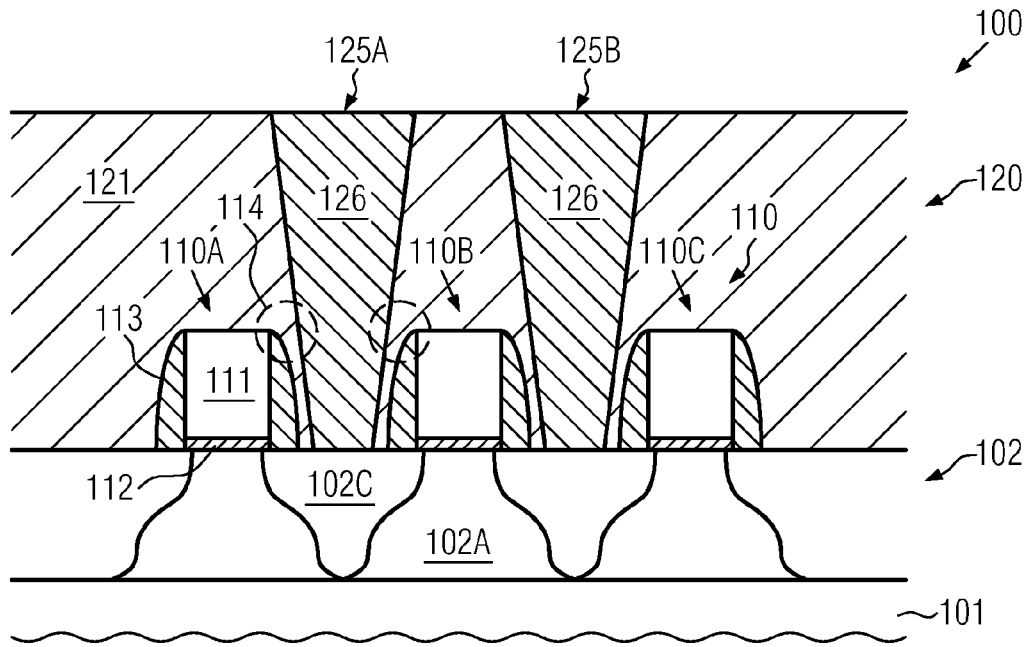
Figure 1D:
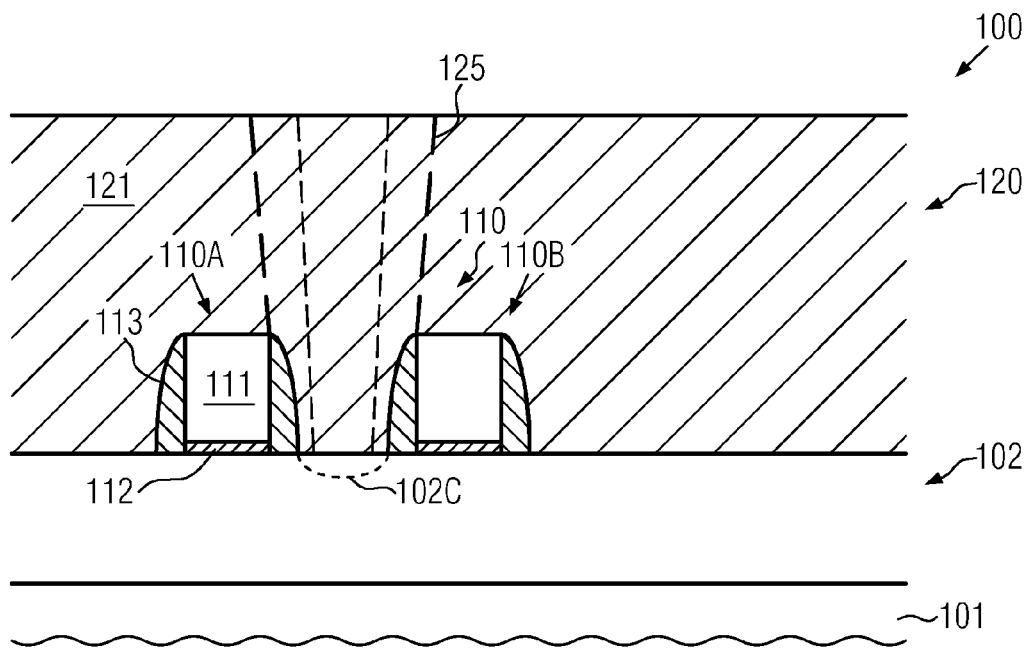
FIG. 1d schematically illustrates a cross-sectional view of the conventional semiconductor device, when even further sophisticated design rules require a reduced lateral distance between closely spaced gate electrode structures.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides manufacturing techniques and semiconductor devices in which the capabilities of sophisticated patterning strategies may be extended upon forming complex vertical contact elements in a dielectric material system, in that a portion of increased tapering may be implemented, for instance by providing at least one additional dielectric material layer that has a different and thus increased tendency for forming sidewall areas of increased sidewall angle. In this manner, the lateral dimension of critical contact openings may be further reduced based on given patterning capabilities of lithography strategies and hard mask systems without requiring the deposition and patterning of additional liner material by appropriately endowing the dielectric material system itself with superior tapering capabilities above any critical device areas. To this end, for a given thickness or height of a dielectric material system, a portion thereof may be replaced by a dielectric material of superior tapering behavior, which may thus result in a reduced lateral dimension prior to further patterning the remaining portion of the dielectric material system. For example, it is well known that, for instance, a silicon nitride material may be patterned on the basis of well-established plasma-assisted etch recipes, wherein process parameters, such as plasma power, precursor gas flows, and in particular, the incorporation of polymerizing gas components, may be controlled so as to obtain a pronounced degree of tapering during the patterning process. In this manner, the lateral dimension of a contact opening may be significantly reduced when etching through the material of superior tapering behavior, such as a silicon nitride material, which may then act as an efficient mask for the further patterning of the remaining portion of the dielectric material system. For example, by providing at least one dielectric layer of superior tapering behavior above closely spaced gate electrode structures, the lateral dimension of a contact opening may be reduced within the layer of superior tapering behavior prior to etching the dielectric material system in the vicinity of the gate electrode edges. In this manner, the further patterning of the dielectric material system may be accomplished at a significantly reduced probability of exposing any gate electrode materials, since the initial patterning capability has been enhanced by the further tapering within the dielectric material system.

Consequently, the principles disclosed herein may be highly advantageously applied to semiconductor devices in which contact elements are to be provided in the interlayer dielectric material system passivating closely-spaced gate electrode structures, since here extremely reduced lateral dimensions have to be provided between the gate electrode structures, which may have a gate length of 40 nm and significantly less. In other cases, the principles disclosed herein may be applied to any vertical contact elements or structures, in which a dielectric material system has to be patterned so as to receive contact openings, which have to comply, at least at a bottom thereof, with very sophisticated design requirements.

With reference to FIGS. 2a-2f, further illustrative embodiments will now be described in more detail, wherein reference may also be made to FIGS. 1a-1d, if appropriate.

Figure 2A:
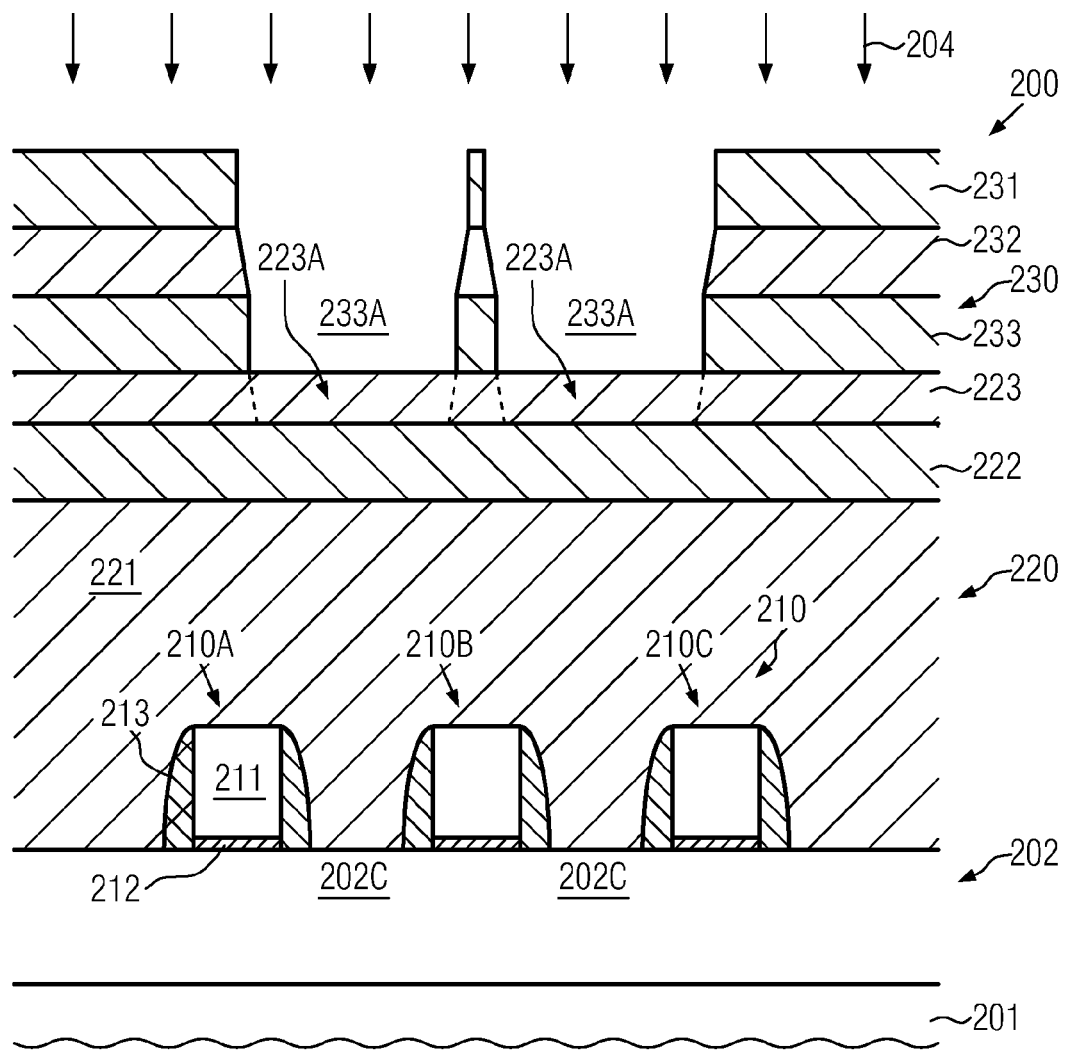
FIGS. 2a-2c schematically illustrate cross-sectional views of a semiconductor device during various manufacturing stages in forming sophisticated vertical contact elements by using at least one additional dielectric layer of superior tapering behavior, according to illustrative embodiments.

FIG. 2a schematically illustrates a cross-sectional view of a semiconductor device 200 in a manufacturing stage in which the device 200 comprises a dielectric material system 220 formed above a semiconductor layer 202, wherein the dielectric material system 220 is to be patterned so as to form contact openings therein and filling the same so as to provide vertical contact elements. In the manufacturing stage shown, the device 200 comprises a substrate 201, which may represent any appropriate carrier material for forming thereabove the semiconductor layer 202, which in turn may comprise a plurality of semiconductor regions or active regions, as is, for instance, also described above with reference to the semiconductor device 100. In some illustrative embodiments, a plurality of closely spaced gate electrode structures 210 may be formed on a portion of the semiconductor layer 202, wherein the gate electrode structures 210 may have any appropriate configuration in terms of material composition and critical dimensions. For example, the gate electrode structures 210 may comprise at least one electrode material 211, such as a semiconductor material, a metal-containing material and the like, which is separated from the semiconductor layer 202 by one or more gate dielectric materials 212, such as silicon oxynitride, a high-k dielectric material and the like. Furthermore, in some illustrative embodiments, a spacer structure 213 may be provided in the gate electrode structures 210. In the embodiment shown, gate electrode structures 210A, 210B, 210C may represent sophisticated gate electrode structures having a gate length of approximately 40 nm and less, such as 30 nm and less, wherein the gate length may be understood as the horizontal extension in FIG. 2A of the electrode material 211 at the gate dielectric material 212. Moreover, the electrode structures 210A, 210B, 210C may represent closely spaced electrode structures, wherein a lateral distance may be 100 nm and significantly less, for instance with respect to a distance between the electrode materials 211, thereby requiring sophisticated patterning strategies for connecting to respective contact regions 202C that may be provided in or above the semiconductor layer 202 between adjacent two of the closely-spaced gate electrode structures 210A, 210B, 210C.

Moreover, in the manufacturing stage shown, the gate electrode structures 210 may be embedded and thus passivated on the basis of a dielectric material system 220, which may also be referred to as an interlayer dielectric material system. For example, the material system 220 may comprise a first dielectric layer 223, which, in the embodiment shown, may represent the top layer of the system 220, followed be a second dielectric layer 222, which, in the embodiment shown, may represent a layer having a superior tapering behavior. Furthermore, an additional dielectric material 221 may be formed so as to be provided above and laterally between the closely-spaced gate electrode structures 210. For example, the dielectric material 221 may be comprised of silicon dioxide, possibly in combination with an etch stop material (not shown), for instance in the form of a silicon nitride material and the like. As previously discussed with reference to the device 100, silicon dioxide represents a well-established dielectric material for an interlayer dielectric material system and may also have advantageous characteristics with respect to passivating the gate electrode structures 210, while well-established deposition techniques are available, in which a high deposition rate with a superior gap fill behavior may be achieved. The layer 222, which may also be referred to as an advanced tapering layer, may be provided in the form of a dielectric material, which, when exposed to an anisotropic etch atmosphere, may be etched, based on appropriately-selected etch parameters, so as to provide increased sidewall angles and thus an increased degree of tapering, compared to the "basic" dielectric material of the system 220, such as silicon dioxide. As also discussed above, silicon nitride may be efficiently used as a dielectric material of superior tapering behavior, thereby providing a plurality of well-established deposition and patterning recipes as silicon nitride is per se a well-established dielectric material in semiconductor technologies. In other cases, the layer 222 may be provided in the form of any other appropriate dielectric material having an increased tapering behavior compared to at least the material 221. For example, a plurality of polymer materials, for instance comprising additional inorganic compounds, such as silicon and the like, may be used, which are known to have a superior tapering behavior when exposed to reactive etch atmospheres. On the other hand, the layer 223 may be provided in the form of any desired material without requiring a specific tapering behavior, wherein, in some illustrative embodiments, the material 223 may be provided, for instance, in the form of a silicon dioxide material, thereby imparting well-established characteristics to the system 220, which may thus act in a similar manner as a conventional silicon dioxide-based interlayer dielectric material system during the further processing of the semiconductor device 200. Consequently, the dielectric material system 220 may be provided on the basis of similar design criteria as a conventional silicon dioxide-based system, for instance in terms of total height of the system 220 and the like, wherein the intermediate layer 222 may provide the superior patterning capability when patterning the system 220. Hence, the dielectric materials 221, 222, 223 may be provided with any appropriate height or thickness so as to obtain a total height that complies with the design requirements for forming the material 200.

The gate electrode structures 210 and the dielectric material system 220 may be formed on the basis of any appropriate process technique. For example, similar process strategies may be applied for forming the gate electrode structures 210 as are also previously discussed with reference to the semiconductor device 100. Thereafter, the dielectric material 221 may be formed, for instance, by applying well-established deposition techniques, for instance based on silicon dioxide, followed by a planarization process, if considered appropriate. To this end, CMP, etching and the like may be applied. Next, the dielectric layer 222 may be deposited, for instance, by well-established plasma-enhanced CVD techniques and the like, followed by the deposition of the layer 223, which may be formed on the basis of similar process techniques as may also be used when forming the material 221.

Thereafter, a material system 230 may be formed and patterned in order to basically define the lateral size and position of contact openings to be formed in the dielectric system 220. For example, the system 230 may comprise a resist layer 231, an ARC layer 232 and a planarization layer 233. It should be appreciated, however, that any other appropriate material system may be used in accordance with any available or appropriate lithography and patterning strategies. The system 230 may then be patterned to provide an appropriate etch mask based on at least a mask opening of one of the layers in the system 230. For example, openings 233A may substantially determine the lateral size and position of openings 223A to be formed in the first dielectric layer 223 of the dielectric system 220. Thereafter, an anisotropic etch atmosphere 204 may be established so as to etch through the layer 223, which may be accomplished on the basis of any well-established etch recipe. As previously discussed, the degree of tapering that may be achieved in well-established dielectric materials, such as silicon dioxide, may be very limited on the basis of presently available etch recipes so that the lateral dimensions of the mask openings 233A may be transferred into the layer 223 with a moderate degree of tapering. Consequently, during the advance of the etch process 204, the opening 223A may be formed with a degree of tapering and thus reduction of the lateral dimension of the openings 223A, which may basically be insufficient for complying with the requirements of a contact opening that has to be extended to the contact region 202C between the closely-spaced gate electrode structures 210.

Figure 2B:
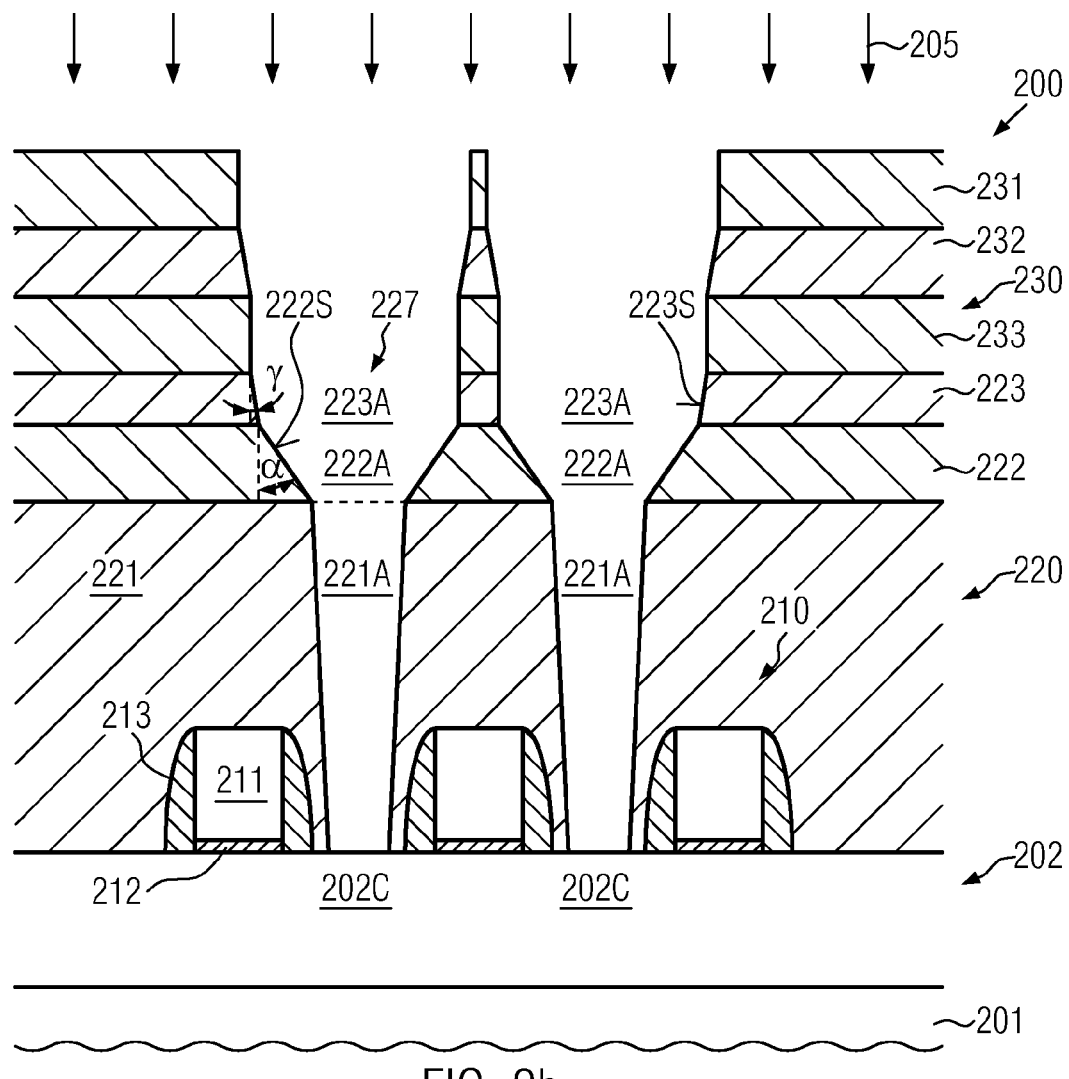

FIG. 2b schematically illustrates the semiconductor device 200 in a further advanced manufacturing stage in which the device 200 is exposed to a further reactive etch atmosphere 205 in order to etch through the layer 222 by using the previously-formed openings 223A as an etch mask. As discussed above, the openings 223A may have sidewall surface areas 223S with a specific sidewall angle gamma (γ), which may be non-zero which, however, is less than required for efficiently reducing the lateral size of contact openings 227 in the vicinity of the gate electrode structures 210. Consequently, during the etch process 205 for etching through the layer 222 having the superior tapering behavior, corresponding openings 222A are formed, wherein sidewall surface areas 222S have a significantly increased sidewall angle α so that the lateral dimension of the opening 222A at the bottom thereof corresponds to the design requirements, although the initial mask openings 233A (FIG. 2a) would not allow an appropriate reduction in lateral size without the provision of the layer 222. In some illustrative embodiments, the reactive etch atmosphere 205 may be established on the basis of well-established anisotropic etch recipes, for instance for etching silicon nitride material, wherein the remaining material 221 may act as an efficient stop material. Similarly, upon performing the process 204 of FIG. 2a, the layer 222 may act as an efficient etch stop material or this layer may exhibit a significantly reduced etch rate, compared to the layer 223, depending on the process parameters of the process 204. It should be appreciated that any appropriate process parameters for the etch processes 204, 205 may be readily determined on the basis of experiments by starting from established etch recipes, for instance for etching silicon dioxide and silicon nitride materials.

The openings 223A and 222A thus represent a first portion and a second portion, respectively, of contact openings 227 to be formed in the dielectric material system 220, wherein the portion 222A may substantially determine the lateral size and position of the contact openings 227. After the etch process 205, the further processing may continued by increasing the depth of the contact openings 227 by etching through the remaining dielectric material 221, which may be accomplished on the basis of any well-established etch recipes, thereby forming a further portion 221A that extends to the contact regions 202C. It should be appreciated that forming the portions 221A may be accomplished on the basis of any well-established etch strategies, for instance similar process parameters may be applied as used when etching through the layer 223, when these layers have similar material characteristics. Moreover, when etching through the remaining dielectric layer 221, also a certain degree of tapering may be achieved, however, at a significantly reduced degree compared to the tapering in the layer 222.

It is to be noted that during the patterning sequence for forming the portions 223A, 222A and 221A, at any appropriate stage a portion or the entire system 230 may be removed prior to completing the contact openings 227. To this end, appropriate resist strip processes and any other plasma-assisted or wet chemical etch steps may be implemented in order to remove any desired portion of the system 230.

After the removal of the system 230 and the exposure of the contact regions 202C, the further processing may be continued by depositing any appropriate conductive material or materials by using any appropriate deposition technique.

Figure 2C:
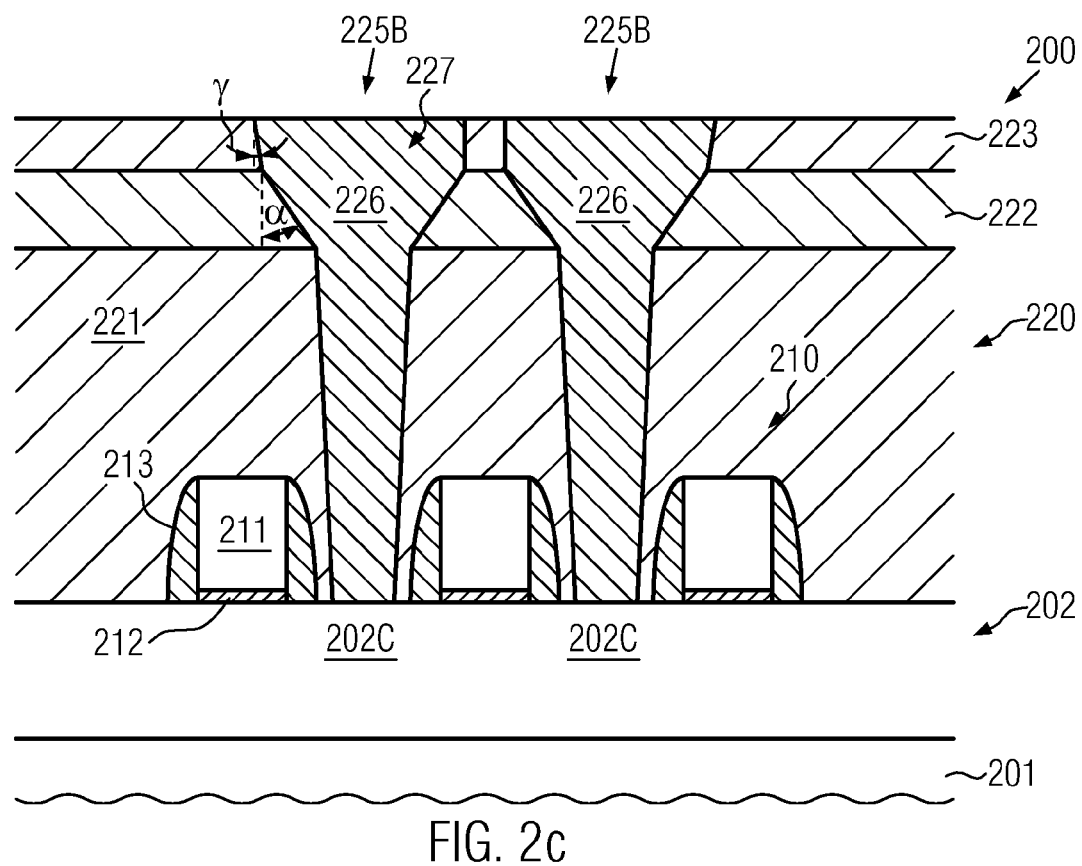

FIG. 2c schematically illustrates the semiconductor device 200 in a further advanced manufacturing stage. As shown, the contact openings 227 are filled with a conductive material 226, thereby forming contact elements 225A, 225B connecting to the contact regions 202C without unduly increasing the probability of exposing sensitive areas of the closely-spaced gate electrode structures 210. To this end, one or more conductive materials may be deposited, for instance on the basis of CVD, electrochemical deposition and the like, wherein, in particular, the increased tapering in the layer 222, as indicated by the sidewall angle α, may additionally provide superior deposition conditions and may also result in superior conductivity of the contact elements 225A, 225B. After the deposition of the material or materials 226, any excess portion thereof may be removed, for instance by CMP and the like, thereby forming the contact elements 225A, 225B as electrically isolated elements.

Figure 2D:
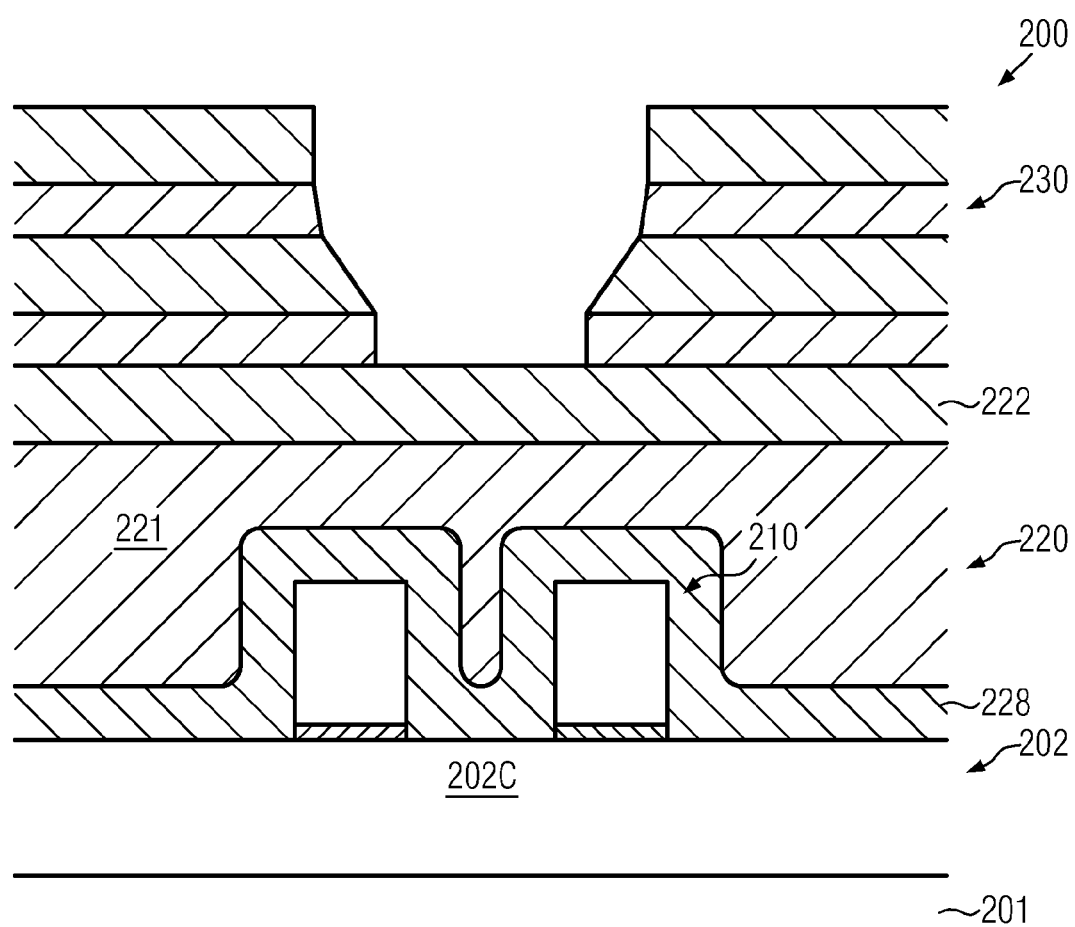
FIGS. 2d-2e schematically illustrate cross-sectional views of the semiconductor device according to still further illustrative embodiments, in which an uppermost layer of the dielectric material system provides a superior tapering behavior upon patterning the dielectric material system.

FIG. 2d schematically illustrates a cross-sectional view of the semiconductor device 200 according to further illustrative embodiments in which the dielectric system 220 may comprise the layer 222 of superior tapering behavior as a top layer. Furthermore, in some illustrative embodiments, the dielectric material system 220 may comprise an additional etch stop layer 228 formed above the semiconductor layer 202 and around the gate electrode structures 210, which may or may not comprise sidewall spacer structures, depending on the device requirements. In the manufacturing stage shown, the layer system 230 is already provided in its patterned state so as to act as an etch mask during the patterning of the layer 222. To this end, any appropriate etch recipe may be applied, in which the superior tapering behavior may be taken advantage of in order to appropriately reduce the lateral dimension of a portion of the contact opening to be formed in the system 220. For example, similar etch recipes may be applied as previously discussed with respect to the etch process 205 of FIG. 2b. In this case, the material 221 may also act as an efficient etch stop material.

Figure 2E:
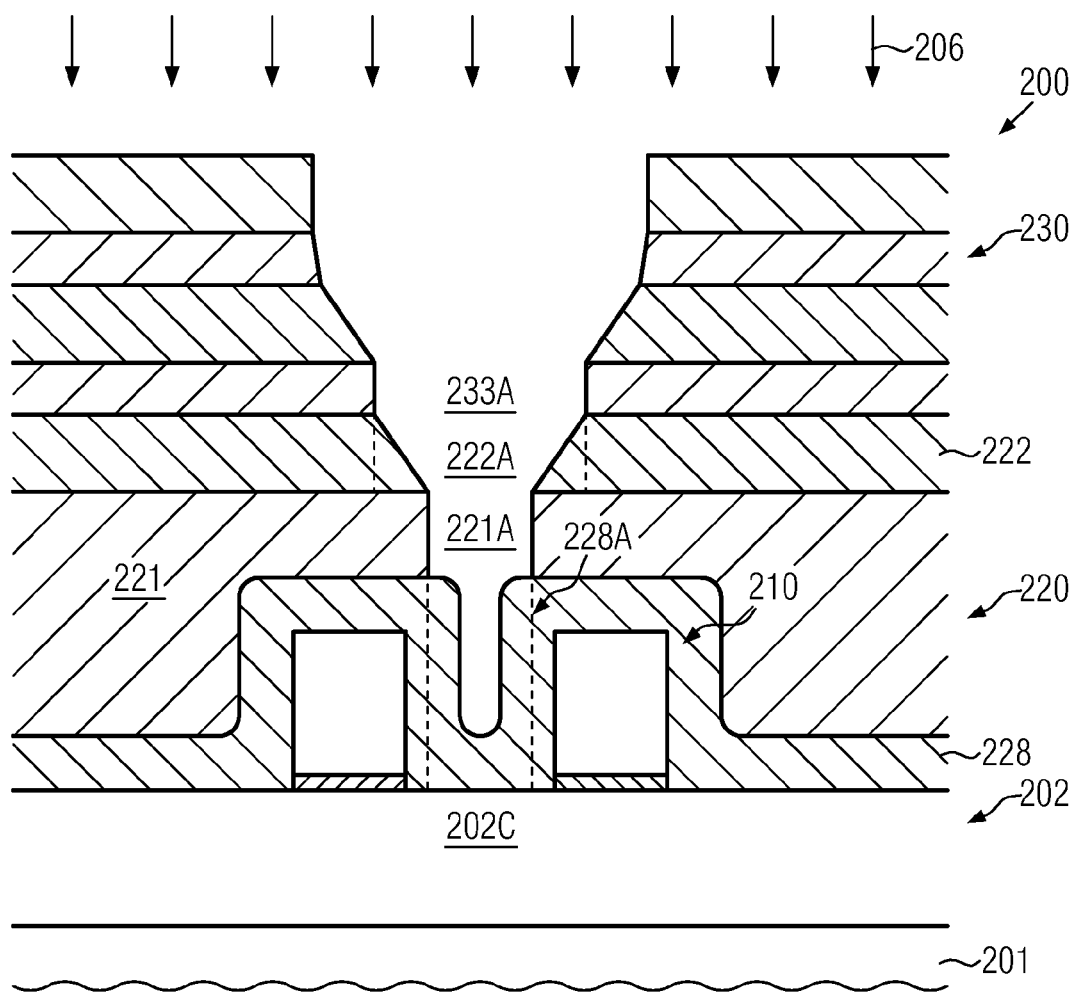

FIG. 2e schematically illustrates the semiconductor device 200 in a further advanced manufacturing stage. As shown, during an etch process 206, the minimum lateral dimension of the opening 222A, i.e., a first portion of the contact opening still to be formed in the system 220 may be transferred into a portion of the dielectric material 221, thereby forming a portion 221A, wherein the etch stop layer 228 is provided, substantially determining the lateral dimension of the opening portion 221A. Thus, in the embodiment shown, the mask opening 233A of the system 230 may be used as an etch mask for forming the highly tapered portion 222A, which in turn may act as an appropriate etch mask during the etch process 206 for forming the opening 221A with the desired reduced lateral dimensions. Thereafter, the further processing may be continued, if the etch stop layer 228 is provided, by applying an appropriate anisotropic etch process for removing material of the layer 228 selectively with respect to the material 221, thereby forming a further portion 228A, as indicated by the dashed lines, which may thus extend down to the contact region 202C. A corresponding etch process may be performed on the basis of any well-established etch recipe. It should be appreciated that, during the corresponding etch process, at least a portion of the material system 230 may still be preserved in order to avoid undue material consumption of the layer 222, wherein, however, the lateral dimension may be increased at the bottom of the opening 222A as indicated by the dashed lines. On the other hand, the material 221 may act as an efficient etch stop material, thereby substantially avoiding undue increase of the opening 221A. Thus, after opening the etch stop layer 228, if provided, the further processing may be continued by removing the remaining portion of the system 230 and filling the resulting contact openings consisting of the portions 222A, 221A and optionally of the portion 228A with an appropriate conductive material.

Figure 2F:
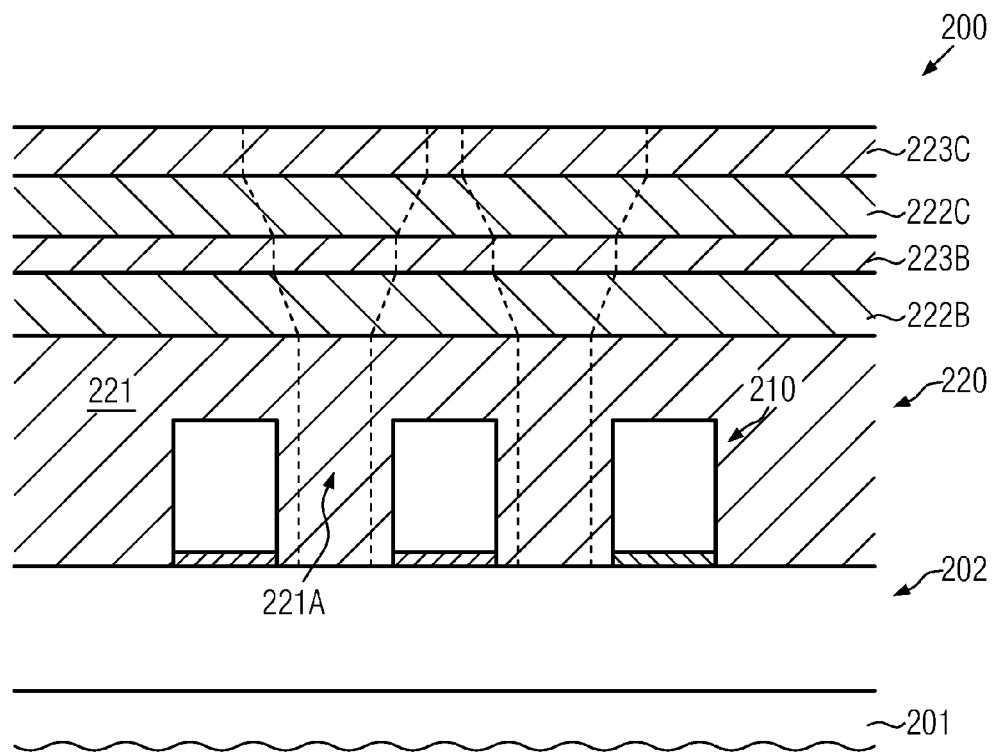
FIG. 2f schematically illustrates a cross-sectional view of the semiconductor device according to a further illustrative embodiment, in which two or more dielectric layers of superior tapering behavior may be implemented into the dielectric material system.

FIG. 2*f* schematically illustrates a cross-sectional view of the semiconductor device 200 according to further illustrative embodiments, in which the dielectric material system 220 may comprise two or more dielectric layers of superior tapering behavior. In the embodiment shown, a top layer of the system 220, indicated by 223C, may represent any appropriate dielectric material that may establish a desired behavior during the further processing of the device 200. For example, a silicon dioxide base material may be used. Thereafter, a first advanced tapering layer 222C may be provided, for instance in the form of a silicon nitride material, which may be followed by a further dielectric material of reduced tapering behavior, such as silicon dioxide, as indicated by 223B. Moreover, a second advanced tapering layer 222B may be provided, followed by the remaining material 221. In this case, the layers 223C, 223B may be used as efficient etch stop materials when patterning the respective lower-lying layers 222C, 222B, respectively. In this manner, a pronounced tapering may be achieved in any of these layers, wherein the corresponding tapering may be "conserved" by appropriately changing the etch atmosphere and patterning the lower-lying layer, which may then act as an efficient etch stop material for further efficiently patterning the material 223B, while any influence on the previously-patterned material layer 222C may no longer be relevant for the resulting tapering in the layer 222B. In this manner, a total thickness of a material layer of advanced tapering behavior may be split into two or more portions, wherein any intermediate etch stop layers may thus provide a superior tapering effect, which may thus even further extend the capability of reducing the lateral dimensions of the opening portions 221A to be formed in the vicinity of the closely-spaced gate electrode structures 210.

After patterning of the system 220, the further processing may be continued by depositing any desired conductive material, wherein again the top layer 223C may provide the desired surface characteristics that corresponds to any well-established dielectric material systems.

Figure 2G:
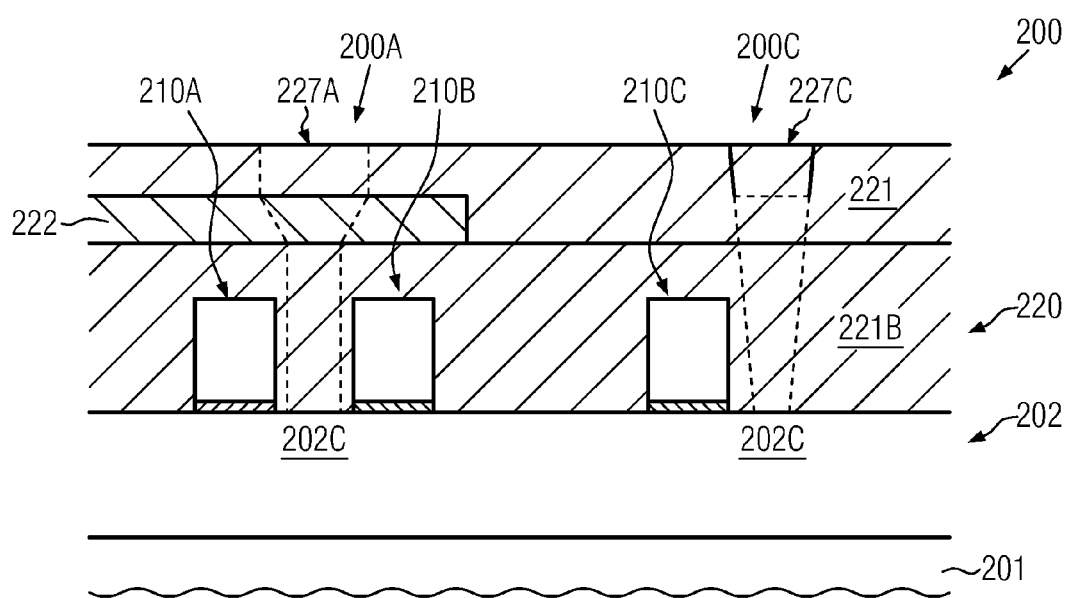
FIG. 2g schematically illustrates a cross-sectional view of the semiconductor device, in which a dielectric layer of superior tapering behavior may be locally provided in critical device areas when patterning a dielectric material system, according to still further illustrative embodiments.

FIG. 2*g* schematically illustrates a cross-sectional view of the device 200 according to further illustrative embodiments, in which the dielectric material system 220 may comprise the layer of advanced tapering behavior 222 locally in a device area 200A, in which closely-spaced gate electrode structures 210A, 210B are provided. On the other hand, the material 222 may not be provided in a second device area 200C, in which gate electrode structures 210C with less critical design rules, in terms of a lateral distance to any neighboring circuit elements, may be provided. Consequently, the contact region 202C positioned between the closely-spaced gate electrode structures 210A, 210B may be contacted by means of a contact opening 227A having the desired reduced lateral dimension at least in a lower portion 221B of the material system 220, while on the other hand, the contact region 202C in the less-critical device area 200C may be contacted by a contact opening 227C having an increased lateral dimension, thereby also providing increased conductivity. The reduced lateral dimension of the contact opening 227A at least in the vicinity of the closely-spaced gate electrode structures 210A, 210B may be accomplished on the basis of the layer 222, as is also discussed above. The configuration as shown in FIG. 2*g* may be formed on the basis of the following processes. After forming the first portion 221B of the system 220, which may be accomplished on the basis of any appropriate process technique, as is also discussed above, the layer 222 may be formed and may be subsequently patterned so as to remove the material of the layer 222 selectively from the device area 200C. To this end, any well-established lithography and etch techniques may be applied, wherein the material 221B may be used as an efficient etch stop material. Thereafter, the material 221 may be deposited and may be planarized in order to obtain the device configuration as shown in FIG. 2*g*. Thereafter, a patterning strategy may be applied as described above, for instance for first patterning material 221, while using the layer 222 as an etch stop layer. Thereafter, the layer 222 may be patterned, while using the material 221 as an etch stop material. Thereafter, the portion 221B may be patterned by using any well-established etch recipe. Consequently, the openings 227A, 227C may be formed in a common patterning process, thereby obtaining superior process robustness upon contacting the region 202C in the critical device area 200A, while achieving enhanced conductivity through connecting to the contact region 202C in the less-critical device area 200C.

As a result, the present disclosure provides semiconductor devices and manufacturing techniques in which vertical contact may be provided on the basis of a dielectric material system that may include at least one dielectric layer of superior tapering behavior. As previously described above, the principles disclosed herein may be advantageously applied to the interlayer dielectric material system provided for passivating sophisticated gate electrode structures. In this manner, the spatial resolution capability of sophisticated lithography and patterning strategies may be even further extended in order to form contact elements extending between closely spaced gate electrode structures having a gate length of 40 nm and less, wherein a lateral distance may be even 50 nm and less. In other cases, the dielectric layer system 220 may correspond to the dielectric material system of a metallization layer, in which vertical contact elements may have to extend to the contact regions 202C, which may thus represent metal lines of a lower-lying metallization layer. Also in this case, superior tapering may be achieved, thereby enabling the contacting of closely-spaced metal lines of a lower-lying metallization layer without requiring the deposition of any additional liner materials, which may typically result in a deterioration of the relative permittivity in sophisticated metallization systems. Similarly, additional liner materials may also be avoided during the patterning of contact openings in the interlayer dielectric material system when connecting to semiconductor-based contact regions, thereby also avoiding undue additional process complexity.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming contact elements of a semiconductor device, the method comprising:
    forming an etch mask above an interlayer dielectric material system that is comprised of a first material layer positioned above a second material layer, said etch mask having a mask opening;
    forming a first portion of a contact opening in said first material layer, said first portion of said contact opening having a first sidewall angle;
    forming a second portion of said contact opening in said second material layer by using said first portion of said contact opening as an etch mask, said second portion of said contact opening having a second sidewall angle that is greater than said first sidewall angle;
    increasing a depth of said contact opening so as to connect to a contact region formed in a semiconductor region between two adjacent gate electrode structures; and
    filling said contact opening with a conductive material so as to form a first contact element connecting to said contact region.

2. The method of claim 1, wherein said first material layer of said interlayer dielectric material system that has a reduced tapering behavior relative to said second material layer.

3. The method of claim 2, wherein increasing a depth of said contact opening comprises etching at least a third material layer of said interlayer dielectric material system after forming said second portion in said second material layer.

4. The method of claim 1, further comprising removing at least a portion of said etch mask prior to the increasing the depth of said contact opening.

5. The method of claim 1, further comprising forming at least one further portion of said contact opening prior to the increasing the depth thereof so as to extend to said contact region, wherein said at least one further portion has a sidewall angle that differs from at least one of said first and second sidewall angles.

6. A method of forming a vertically oriented contact element, the method comprising:
    forming a dielectric material system above a contact region of a semiconductor device, said contact region being located between adjacent gate electrode structures, said dielectric material system having at least a first dielectric layer formed above a second dielectric layer, said first and second dielectric layers having a different tapering behavior when exposed to reactive etch atmospheres;
    forming a first portion of a contact opening in said first dielectric layer by using an etch mask formed above said first dielectric layer, said first portion of said contact opening having a first sidewall angle;
    forming a second portion of said contact opening in said second dielectric layer, said second portion of said contact opening having a second sidewall angle that is greater than said first sidewall angle;
    increasing a depth of said contact opening so as to extend to said contact region; and
    filling said contact opening with a conductive material.

7. The method of claim 6, further comprising forming a third portion in a third dielectric layer of said dielectric material system prior to the increasing the depth of said contact opening so as to extend to said contact region, wherein said third layer has a tapering behavior that differs from at least one of said first and second dielectric layers.

8. The method of claim 6, further comprising removing at least a portion of said etch mask prior to the increasing the depth of said contact opening so as to extend to said contact region.

9. The method of claim 6, wherein said dielectric material system is formed above a metallization layer of a metallization system of said semiconductor device.

10. The method of claim 6, further comprising removing one of said first and second dielectric layers from a predefined device area and forming a second contact opening in said predefined device area, wherein said second contact opening has a greater minimal width compared to said contact opening.

* * * * *